United States Patent [19]

Wilcox

[11] Patent Number: 5,023,474

[45] Date of Patent: Jun. 11, 1991

[54] ADAPTIVE GATE CHARGE CIRCUIT FOR POWER FETS

[75] Inventor: Milton E. Wilcox, Saratoga, Calif.

[73] Assignee: National Semiconductor Corp., Santa Clara, Calif.

[21] Appl. No.: 433,557

[22] Filed: Nov. 8, 1989

[51] Int. Cl.$^5$ .................. H03K 3/01; H03K 17/60
[52] U.S. Cl. ......................... 307/270; 307/570; 307/571; 307/572; 307/578; 307/581; 307/582
[58] Field of Search ................... 307/570–572, 307/575, 577–578, 581–582, 264, 270

[56] References Cited

U.S. PATENT DOCUMENTS 4,153,909  5/1979  Dobkin ........................... 357/44
4,894,568  1/1990  Pavlin ............................ 307/578

*Primary Examiner*—Stanley D. Miller
*Assistant Examiner*—Margaret Rose Wambach
*Attorney, Agent, or Firm*—Limbach, Limbach & Sutton

[57] ABSTRACT

An adaptive gate charge circuit for switching a power FET on in response to a control signal. The adaptive gate charge circuit includes driving circuitry that responds to assertion of a control signal by providing a charging current from a charge pump reservoir capacitor to the gate of the power FET for an initial time period sufficient to switch the power FET on. After the initial time period, holding circuitry provides holding current from the charge pump to the power FET gate to compensate for charge leakage. Current limiting circuitry connected to the holding circuitry limits current drain from the charge pump after the initial time period to the holding current required to compensate for charge leakage plus a minimum additional current.

5 Claims, 1 Drawing Sheet

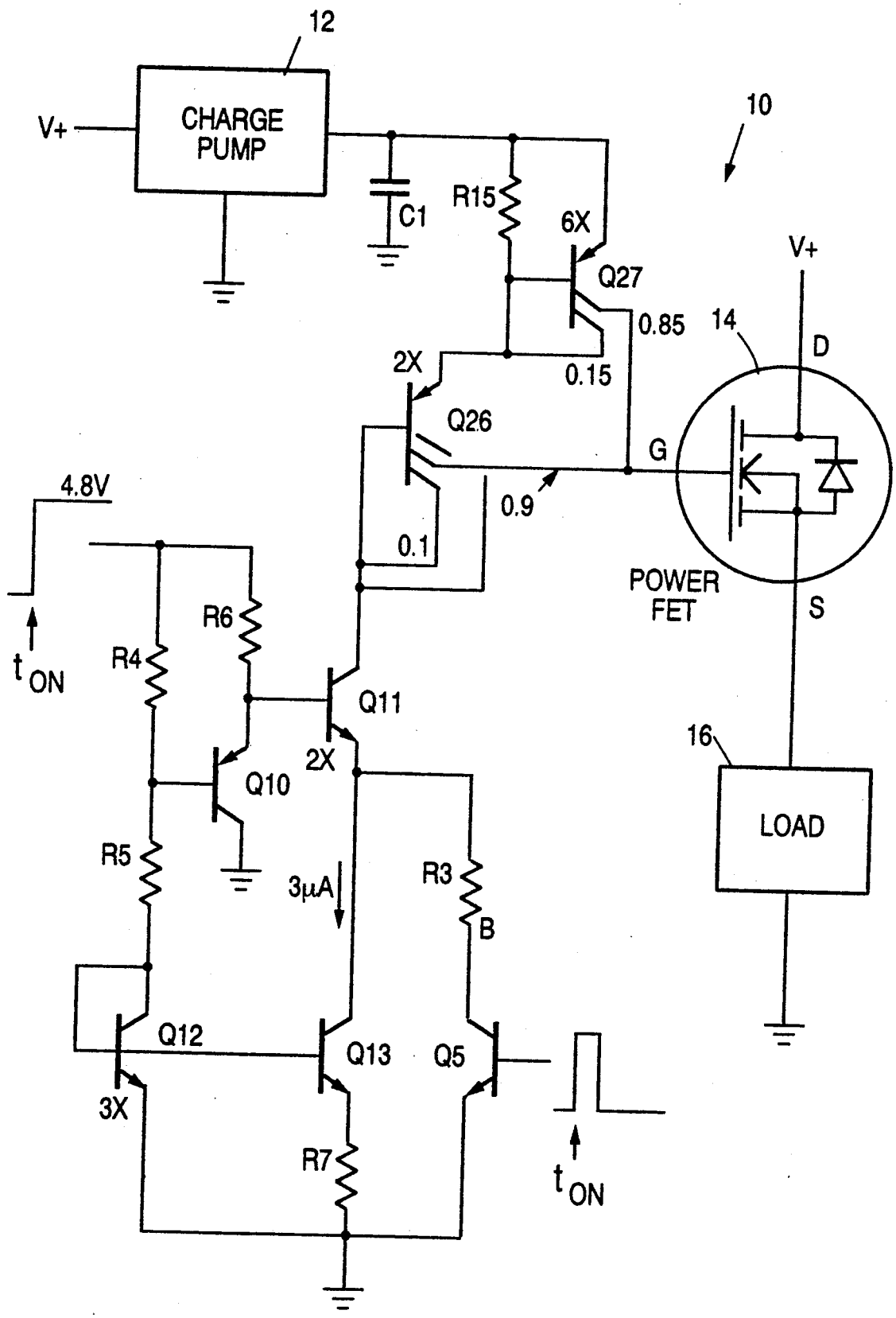

ADAPTIVE GATE CHARGE CIRCUIT FOR POWER FETS

BACKGROUND OF THE INVENTION

1. Field of the Invention

The present invention relates generally to electronic circuits and, in particular, to an adaptive charge circuit which provides an initial current pulse to turn on a power FET and then provides low, adaptive holding current to maintain the gate of the power FET at the "on" potential with minimum current drain from the charge supply.

2. Discussion of the Prior Art

The gate impedance of a large power MOSFET transistor is highly capacitive. Hence, the terms "charge" and "discharge" are used to describe turning the power transistor on and off, respectively.

In all high-side driver applications (and in low-side drivers operating from low supply voltages), the gate of the power FET must be raised above the supply potential by gate charge circuitry in order to achieve a low Rds (on) in the FET. This requires the use of a charge pump to supply the gate charge circuitry. Since charge pumps typically have very high output resistances, design of the gate charge circuit must minimize extraneous current drain from the charge pump. That is, current which is flowing from the charge pump but is not flowing into the gate of the power FET should be minimized.

Typically, low current drain is achieved by utilizing MOS charge circuits, since MOS devices can act as true on/off switches.

U.S. patent application Ser. No. 07/353,123, filed May 17, 1989, by Stephen W. Hobrecht and commonly-assigned herewith, discloses a charging circuit for a diffused metal oxide semiconductor transistor (DMOST) power device. The Hobrecht charging circuit, which utilizes a combination of bipolar devices and MOS switches, employs a differential amplifier gate driver that operates at a relatively low quiescent current when the DMOST is off. When the DMOST is to be switched from off to on, the differential amplifier tail current is briefly raised to a substantially higher value so that the DMOST parasitic gate capacitance can quickly be driven to the on level. While the Hobrecht charging circuit provides definite advantages over previously known charging circuits, a major deficiency of MOS switches is that, in some harsh operations environments, the breakdown voltages of the MOS transistors are insufficient for the transistors to withstand high voltage transients. For example, in automotive systems, the possibility of inadvertent reverse battery conditions or loose battery cables has caused some automobile manufacturers to specify that integrated circuits utilized in these applications be capable of withstanding up to 60 V, well above the breakdown voltage of commonly available MOS transistors. Thus, additional protective circuitry is required to shield the MOS switching transistors from voltage transients. This additional circuitry not only makes the product more expensive but also utilizes IC die area with an accompanying decrease in yield.

Another deficiency of conventional charging circuitry is the use of voltage drive at the power FET gate in order to obtain high speed on/off switching. Given that $$I = C\left(\frac{dV}{dt}\right)$$

it can easily be seen that rapid changes in voltage cause high current flow. This high current flow creates an electric field which may be disruptive to other circuitry which is located in close physical proximity to the charging circuitry. For example, in automotive applications, the electric field caused by a voltage drive charging circuit may affect on-board computers that control braking and/or acceleration.

SUMMARY OF THE INVENTION

The present invention provides an adaptive gate charge circuit for switching a power FET on in response to a control signal. The adaptive gate charge circuit includes driving circuitry that responds to assertion of a control signal by providing a charging current from a charge pump reservoir capacitor to the gate of the power FET for an initial time period sufficient to switch the power FET on. After the initial time period, holding circuitry provides holding current from the charge pump to the power FET gate to compensate for charge leakage. While the holding circuitry maintains the turn-on potential at the power FET gate, current limiting circuitry connected to the holding circuitry limits current drain from the charge pump to the holding current required to compensate for charge leakage plus a preselected minimum additional current.

The foregoing and additional features and advantages of the present invention will be more fully understood and appreciated upon consideration of the following detailed description of the invention, which should be considered in conjunction with the accompanying drawings.

BRIEF DESCRIPTION OF THE DRAWINGS

The drawing illustrate a schematic diagram of an embodiment of an adaptive gate charge circuit in accordance with the present invention.

DETAILED DESCRIPTION OF THE INVENTION

The drawing provides a schematic diagram of an embodiment of an adaptive gate charge circuit 10 in accordance with the present invention. The illustrated circuit can be implemented in integrated form using well known manufacturing processes.

As shown in the drawing, adaptive gate charge circuit 10 is connected between a conventional charge pump 12 and a conventional power FET 14. Power FET 14 is shown in the drawing as connected in a high side driver configuration in which the other side of load 16 is connected to ground. It will be understood by those skilled in the art that the concepts of the invention apply equally as well to gate charge circuits utilized in low side driver configurations.

The input signal to circuit 10 provides base drive to NPN input transistor Q5. Transistor Q5 has its emitter connected to ground and its collector connected via 13 Kohm resistor R3 to the 2X emitter of cascode NPN transistor Q11. The collector of transistor Q11 is connected to the base-collector junction of multiple collector PNP current mirror transistor Q26. The 2X emitter of transistor Q26 is connected to one of the multiple collectors of 6X PNP current mirror transistor Q27. The outputs of current mirror transistors Q26 and Q27 are commonly connected to the gate of power FET 14.

A 4.8 V supply provides base drive to NPN transistor Q11 via 10 Kohm resistor R6 and to PNP transistor Q10 via 27 Kohm resistor R4. The base of transistor Q10 is also connected to ground via 13 Kohm resistor R5 and NPN transistors Q12 and Q13. The collector of transistor Q13 is connected to the emitter of cascode transistor Q11 and its emitter is connected to ground via 20 Kohm resistor R7.

As shown in the drawing, at time $t_{on}$, transistor Q5 is turned on by a brief (approx. 25 μS.) drive pulse and approximately 150 μA current flows in transistor Q11. This current is multiplied by a factor of 10 in current mirror transistor Q26 and drives current mirror Q27, which further multiplies the current. The combined collector current of transistors Q26 and Q27 (which amounts to about 6 mA; although, as will be recognized by those skilled in the art, the actual value will be reduced by base current losses) then charges the gate of the power FET 14 from reservoir capacitor C1.

After the initial drive pulse, transistor Q5 turns off and the charge circuit 10 reverts to an adaptive sustaining mode with only the .3 μA from transistor Q13 flowing in transistor Q11. Even when multiplied by a factor of 10 in current mirror transistor Q26, the current level flowing in 5 Kohm resistor R15 is insufficient to threshold the $V_{BE}$ of, i.e. turn on, transistor Q27. Thus, transistor Q27 remains off and current mirror transistor Q26 supplies the sole current to the gate of the power FET 14. If additional charge is required to complete the gate turn-on, up to 27 μA (9×3 μA) is available from current mirror transistor Q26, resulting in 30 μA being drawn from charge pump 12. When the gate of power FET 14 raises to the charge pump potential, the primary collector of current mirror transistor Q26 saturates and a concentric collector, which encloses the primary collector, returns excess current to the base. This "nested collector" PNP geometry is disclosed by Dobkin in FIG. 3 and the associated text of U.S. Pat. No. 4,153,909, which patent is hereby incorporated by reference.

If no current is required by the gate of power FET 14, all of the emitter current of current mirror transistor Q26 returns to its base, causing current mirror transistor Q26 to behave as a diode. This reduces the current drain on charge pump 12 to just 3 μA. Any leakage current (up to 27 μA) required to hold the gate of power FET 14 high will be supplied by charge pump 12 through current mirror transistor Q26. Thus, the effective current ratio of transistor Q26 automatically adapts to the needs of the power FET 14, thereby minimizing the current drain from the charge pump 12.

It should be understood that various alternatives to the embodiment of the invention described herein may be utilized in practicing the invention. It is intended that the following claims define the scope of the invention and that devices within the scope of these claims and their equivalents be covered thereby.

What is claimed is:

1. An adaptive gate charge circuit comprising
   (a) driving means responsive to a control signal for providing a charging current from a charge supply for an initial time period sufficient to charge an element to a desired potential;
   (b) adaptive sustaining means connected to the charge supply for providing sufficient holding current from the charge supply to the element after the initial time period to compensate for charge leakage from the element; and
   (c) current limiting means connected to the adaptive sustaining means for limiting current drain from the charge supply after the initial time period to the holding current plus a minimum additional current value.

2. An adaptive gate charge circuit connected between a charge supply and a gate of a power FET for controlling current provided to the power FET gate, the adaptive gate charge circuit comprising charging means responsive to a control signal for providing a current pulse from the charge supply to the gate of the power FET during an initial time period sufficient to turn the power FET on, the charging means including adaptive sustaining means connected between the charge supply and the gate of the power FET for providing sufficient holding current to the gate of the power FET after the initial time period to compensate for charge leakage from the gate of the power FET, and current limiting means connected between the adaptive sustaining means and the gate of the power FET for limiting current drain from the charge supply after the initial time period to the holding current plus a minimum additional current value.

3. An adaptive gate charge circuit as in claim 2 that includes means for providing an initial current for the initial time period and wherein the adaptive sustaining means comprises:
   (a) a first multiple collector current mirror PNP transistor having its emitter connected to the charge supply, its primary collector connected to the power FET gate, and its base connected to a secondary collector and to the charge supply via a resistive element; and
   (b) a second multiple collector current mirror PNP transistor having its emitter connected to a base-secondary collector junction of the first current mirror transistor, its primary collector connected to the gate of the power FET, a secondary collector connected to its base and a concentric collector enclosing the primary collector.

4. An adaptive gate charge circuit as in claim 3 that includes means for generating a sustaining current to the base of the second current mirror transistor after the initial time period sufficient to turn the second current mirror transistor on but insufficient to turn on the first current mirror transistor whereby the second current mirror transistor supplies the sole current to the gate of the power FET gate after the initial time period.

5. An adaptive gate charge circuit as in claim 3 wherein the concentric collector of the second current mirror transistor returns excess current to its base such that, when the primary collector of the second current mirror transistor saturates, all emitter current of the second current mirror transistor is returned to its base causing the second current mirror transistor to behave as a diode.

* * * * *